(12) United States Patent
Gustavsen et al.

(10) Patent No.: US 8,195,412 B2
(45) Date of Patent: Jun. 5, 2012

(54) ITERATIVE METHOD FOR CHARACTERIZING THE FREQUENCY DEPENDENCE OF THE LINEAR PROPERTIES OF AN ELECTRICAL COMPONENT

(75) Inventors: Bjorn Gustavsen, Trondheim (NO);
Christoph Heitz, Elgg/ZH (CH);
Martin Tiberg, Genève (CH)

(73) Assignee: ABB Technology AG, Zurich (CH)

( * ) Notice: Subject to any disclaimer, the term of this patent is extended or adjusted under 35 U.S.C. 154(b) by 157 days.

(21) Appl. No.: 12/572,696

(22) Filed: Oct. 2, 2009

(65) Prior Publication Data
US 2010/0023288 A1 Jan. 28, 2010

Related U.S. Application Data

(63) Continuation of application No. PCT/EP2007/053170, filed on Apr. 2, 2007.

(51) Int. Cl.
*G01R 29/00* (2006.01)
*G06F 17/16* (2006.01)
(52) U.S. Cl. .............. 702/66; 702/64; 702/75; 702/196; 703/2; 703/4; 703/14
(58) Field of Classification Search .................... 702/66, 702/64, 65, 75, 196
See application file for complete search history.

(56) References Cited

U.S. PATENT DOCUMENTS

| 5,284,142 | A | | 2/1994 | Goble et al. |
| 6,041,170 | A | * | 3/2000 | Feldmann et al. ................. 703/2 |
| 2004/0193382 | A1 | * | 9/2004 | Adamian et al. .............. 702/118 |
| 2008/0114572 | A1 | * | 5/2008 | Feldmann et al. ................. 703/2 |

FOREIGN PATENT DOCUMENTS
EP 1 684 081 A1 7/2006

OTHER PUBLICATIONS

International Search Report for PCT/EP2007/053170 completed Dec. 11, 2007.
Written Opinion for PCT/EP2007/053170 completed Dec. 11, 2007.
Bjorn Gustavsen, "Improving the Pole Relocating Properties of Vector Fitting", Jul. 2006, pp. 1587-1592, vol. 21, No. 3.
Shawn F. Silverman, "On the Simulation of Overhead Transmission Lines", Aug. 2005, pp. 1-72, Department of Electrical and Computer Engineering, University of Manitoba.

(Continued)

*Primary Examiner* — Hal Wachsman
(74) *Attorney, Agent, or Firm* — Buchanan Ingersoll & Rooney PC

(57) ABSTRACT

A method and device characterize linear properties of an electrical component having n>1 ports. The linear properties of the component are described in a matrix relating a voltage applied to the ports to a current through the ports. A frequency dependence of the matrix is approximated to preserve eigenvalues of the matrix by a pole-residual model. The method includes: (a) obtaining a set of values of the matrix at discrete frequencies, and obtaining eigenvalues and eigenvectors for each value; (b) fitting a set of vector equations to the eigenvalues and eigenvectors with a first set of pole frequencies; and (c) calculating a second set of pole frequencies by a vector fitting process for all modes of an element of the matrix. Steps (b) and (c) are repeated using the second set of pole frequencies in step (c) in a subsequent step (b) until a stop condition is met.

16 Claims, 5 Drawing Sheets

OTHER PUBLICATIONS

Bjorn Gustavsen et al., "Enforcing Passivity for Admittance Matrices Approximated by Rational Functions", Feb. 2001, pp. 97-104, vol. 16, No. 1.

Bjorn Gustavsen, "Relaxed Vector Fitting Algorithm for Rational Approximation of Frequency Domain Responses", May 2006, pp. 97-100.

Notification Concerning Transmittal of International Preliminary Report on Patentability (Forms PCT/IB/326, PCT/IB/373 and PCT/ISA/237) issued in corresponding International Application No. PCT/EP2007/053170 dated Oct. 15, 2009.

Coelho et al., Generating High-Accuracy Simulation Models Using Problem-Tailored Orthogonal Polynomials Basis 53(12) IEEE Transactions on Circuits and Systems—I 2705-2714 (Dec. 2006).

Grivet-Talocia et al., Package Macromodeling via Time-Domain Vector Fitting 13(11) IEEE Microwave and Wireless Components Letters 472-474 (Nov. 2003).

Gustavsen, Improving the Pole Relocating Properties of Vector Fitting 21(3) IEEE Transaction on Power Delivery 1587-1592 (Jul. 2006).

Gustavsen et al., Rational Approximation of Frequency Domain Responses by Vector Fitting 14(3) IEEE Transactions on Power Delivery 1052-1061 (Jul. 1999).

Levy, Complex-Curve Fitting 4 IRE Transactions Automatic Control 37-44 (May 1959).

Sanathanan et al., Transfer Function Synthesis as a Ratio of Two Complex Polynomials 8 IEEE Transactions on Automatic Control 56-58 (1963).

Tiberg et al. New Simulation Methodology for Power Systems—Assumption Free Analysis Entirely Based on Measurement 1(3) EMTP-RV Newsletter 20-26 (Dec. 2006).

* cited by examiner

ITERATIVE METHOD FOR CHARACTERIZING THE FREQUENCY DEPENDENCE OF THE LINEAR PROPERTIES OF AN ELECTRICAL COMPONENT

RELATED APPLICATIONS

This application claims priority as a continuation application under 35 U.S.C. §120 to PCT/EP2007/053170 filed as an International Application on Apr. 2, 2007 designating the U.S., the entire content of which is hereby incorporated by reference in its entirety.

FIELD

The disclosure relates to a method for characterizing the frequency dependence of the linear properties of an electrical component as well as to a device for carrying out such a method.

BACKGROUND INFORMATION

Wideband modeling of linear electrical components (such as devices and systems) from measured data is of growing importance for the design and verification of electrical systems. The modeling is usually based on "fitting" a linear model by varying a set of parameters that characterize the model behavior, such as admittance (y), impedance (z), and scattering (s) parameters in the frequency domain or the time domain. The model can be based on a ratio of polynomials (see [1] E. C. Levy, "Complex curve fitting", IRE Trans. Automatic Control, vol. 4, pp. 37-44, May 1959, [2] C. K. Sanathanan and J. Koerner, "Transfer function synthesis as a ratio of two complex polynomials", IEEE Trans. Automatic Control, vol. 8, pp. 56-58, 1963), or orthogonal polynomial functions (see [3] C. P. Coelho, J. R. Phillips, and L. M. Silveira, "Generating high-accuracy simulation models using problem-tailored orthogonal polynomials basis", IEEE Trans. Circuits and Systems-I, vol. 53, no. 12, pp. 2705-2714, December 2006). Recently, the pole relocating vector fitting technique (see [4] B. Gustaysen, and A. Semlyen, "Rational approximation of frequency domain responses by vector fitting", IEEE Trans. Power Delivery, vol. 14, no. 3, pp. 1052-1061, July 1999) has become widely applied, and several enhancements have been proposed (see [5] S. Grivet-Talocia, "Package macromodeling via timedomain vector fitting", IEEE Microwave and Wireless Components Letters, vol. 13, no. 11, pp. 472-474, November 2003, [6] B. Gustaysen, "Improving the pole relocating properties of vector fitting", IEEE Trans. Power Delivery, vol. 21, no. 3, pp. 1587-1592, July 2006). The modeling is complete when the parameters have been found that describe the tabulated data with a given accuracy level. The fitting described in the literature is based on fitting the individual elements of the admittance matrix. The resulting model is therefore well suited for calculating the currents if the applied voltages are given.

However, there is no guarantee that the model will behave satisfactorily with a different terminal condition. For instance, the fit may be poor for the case that currents are given, and the voltages have to be determined. Such effects can occur in cases where the admittance matrix contains a large eigenvalue spread, such that the ratio between the largest and smallest eigenvalue is relatively large.

SUMMARY

A method is disclosed for characterizing linear properties of an electrical component having n>1 ports, which linear properties are described in a matrix Y relating a voltage applied to the ports to a current through the ports, wherein a frequency dependence of Y is approximated by:

$$Y(s) \cong Y_{rat}(s) = \sum_m \frac{R_m}{s - a_m} + D + sE$$

wherein the subscript "rat" denotes a rational function, m runs through 1 to a number N of poles, $R_m$ with m=1 to N are frequency independent matrices, D and E are frequency independent matrices or zero, s denotes a complex angular frequency i$\omega$ and $a_m$ with m=1 to N are complex angular frequencies of the poles. The method includes:

a) obtaining a set of values Y(s) of Y at discrete frequencies s, and, for each value Y(s), obtaining eigenvalues $\lambda_i$ and eigenvectors $t_i$ with i=1 to n;

b) fitting a set of n vector equations:

$$\frac{\lambda_i}{|\lambda_i|} \overbrace{\left(\sum_{m=1}^{N} \frac{\tilde{r}_m}{s - a_m} + 1\right)}^{\sigma(s)} t_i \cong \frac{1}{|\lambda_i|}\left(\left(\sum_{m=1}^{N} \frac{R_m}{s - a_m} + D + sE\right) \cdot t_i\right)$$

to the eigenvalues $\lambda_i$ and eigenvectors $t_i$, wherein $\tilde{r}_m$ is a frequency-independent scalar with m=1 to N, by using a first set of pole frequencies $a_m$ and by varying $\tilde{r}_m$, $R_m$ and, if assumed to be non-zero, D and E;

c) calculating a second set of pole frequencies from:

$$\{a_m\} = \mathrm{eig}(A - b \cdot c^T)$$

wherein A is a diagonal matrix holding the first set of pole frequencies $a_m$ as diagonal elements, b is a vector of ones, c is a vector holding $\tilde{r}_m$ for m=1 to N as obtained by step b), and eig is an operator returning a vector holding eigenvalues of a matrix; and d) repeating steps b) and c) by using the second set of pole frequencies $a_m$ of step c) as the first set of pole frequencies in a subsequent step b) until a stop condition is met.

A device is disclosed for characterizing linear properties of an electrical component having n>1 ports, which linear properties are described in a matrix Y relating a voltage applied to the ports to a current through the ports, wherein a frequency dependence of Y is approximated by:

$$Y(s) \cong Y_{rat}(s) = \sum_m \frac{R_m}{s - a_m} + D + sE$$

wherein the subscript "rat" denotes a rational function, m runs through 1 to a number N of poles, $R_m$ with m=1 to N are frequency independent matrices, D and E are frequency independent matrices or zero, s denotes a complex angular frequency i$\omega$ and $a_m$ with m=1 to N are complex angular frequencies of the poles. The device includes:

a processor programmed to perform the computer executed steps of:

a) obtaining a set of values Y(s) of Y at discrete frequencies s, and, for each value Y(s), obtaining eigenvalues $\lambda_i$ and eigenvectors $t_i$ with i=1 to n;

b) fitting a set of n vector equations:

$$\frac{\lambda_i}{|\lambda_i|}\left(\sum_{m=1}^{N}\frac{\tilde{r}_m}{s-a_m}+1\right)t_i \cong \overbrace{\frac{1}{|\lambda_i|}\left(\left(\sum_{m=1}^{N}\frac{R_m}{s-a_m}+D+sE\right)\cdot t_i\right)}^{\sigma(s)}$$

to the eigenvalues $\lambda_i$ and eigenvectors $t_i$, wherein $\tilde{r}_m$ is a frequency-independent scalar with m=1 to N, by using a first set of pole frequencies $a_m$ and by varying $\tilde{r}_m$, $R_m$ and, if assumed to be non-zero, D and E;

c) calculating a second set of pole frequencies from:

$$\{a_m\} = \text{eig}(A - b \cdot c^T)$$

wherein A is a diagonal matrix holding the first set of pole frequencies $a_m$ as diagonal elements, b is a vector of ones, c is a vector holding $\tilde{r}_m$ for m=1 to N as obtained by step b), and eig is an operator returning a vector holding eigenvalues of a matrix; and d) repeating steps b) and c) by using the second set of pole frequencies $a_m$ of step c) as the first set of pole frequencies in a subsequent step b) until a stop condition is met.

BRIEF DESCRIPTION OF THE DRAWINGS

Further embodiments, advantages and applications of the disclosure are given in the following description, which makes reference to the attached figures, wherein.

DETAILED DESCRIPTION

Figure 1:
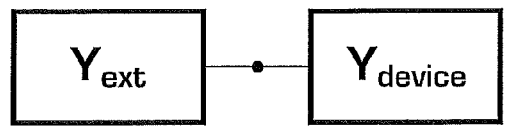
FIG. 1 is an exemplary electrical device (component) with applied external device.

A method is disclosed which can approximate frequency domain responses with increased accuracy, such as for cases with a large spread of eigenvalues.

Exemplary embodiments reformulate the known vector fitting technique to fit the modal response rather than matrix elements, and weighting can be chosen equal to an inverse of a corresponding eigenvalue magnitude in order to achieve a relative accuracy criterion for the eigenvalue fit. The procedure can improve accuracy for cases with a large eigenvalue spread.

The disclosure also relates to a device for carrying out the method. Such a device can include suitable special purpose computer and/or software components running on a computer, and/or dedicated, specialized hardware.

In the present text, upper case boldface letters (such as Y) denote matrices and lower case boldface letters (such as v) denote vectors.

The term "electrical component" is to be understood broadly and can relate to an individual device, such as a transformer, or to an assembly of several devices, such as a system of transformers, motors etc. interconnected by power lines. However, it is restricted to linear electrical systems that are fully described by their frequency dependent admittance matrix.

INTRODUCTION

As an example, consider an electrical component having n>1 ports. Its linear electrical properties are described by its admittance matrix Y, defining current response i through the ports when applying voltages v to the ports:

$$i(s) = Y(s)v(s), \quad (1)$$

wherein s denotes the complex angular frequency iω of the currents and voltages.

If current sources are applied to the terminals, the voltage response at any frequency is:

$$v = Zi = Y^{-1}i = (T_Y \Lambda T_Y^{-1})^{-1}i = T_Y \Lambda_Y^{-1} T_Y^{-1} i \quad (2)$$

wherein T or $T_Y$ is a (frequency dependent) transformation matrix and Λ or $\Lambda_Y$ is a diagonal matrix holding the eigenvalues of Y.

According to (2), small eigenvalues of Y correspond to large eigenvalues in Z. If Y contains both large and small eigenvalues, fitting of the elements of Y is likely to result in a poor representation of the small eigenvalues. Thus, fitting the elements of Y results in a model that is best suited for reproducing terminal currents if the voltages are given. However, the model is not well suited for reproducing voltages with given currents. Analogously, if the impedance matrix would be fitted, it would be best suited for reproducing voltages for given currents, but would yield poor results for the case that voltages are applied and currents are to be determined.

For fitting a model that is equally well suited for all possible applications, all eigenvectors of the admittance (or impedance) matrix should, in an exemplary embodiment, be represented with a similar accuracy.

Exemplary embodiments disclosed herein can fit the model in such a way that the error of the model with respect to the eigenvalues $\lambda_i$ is related to the eigenvalue magnitude, resulting in a relative criterion:

$$\left|\frac{\lambda_i^{model}(s) - \lambda_i^{data}(s)}{\lambda_i^{data}(s)}\right| < \varepsilon, \quad (3)$$

$$i = 1 \ldots n,$$

where the superscript "model" refers to the eigenvalues calculated from the model (by performing a diagonalization), while the superscript "data" refers to the eigenvalues obtained directly from the matrix Y.

Usage of a relative criterion of the type of eq. (3) can "balance" the accuracy of the model with respect to voltage application and current application, respectively, and with respect to any other (hybrid) terminal condition, such that the relative model error will be of the same order of magnitude for all applications.

Exemplary embodiments disclosed herein can identify a pole-residue model according to eq. (4) below, with D and E possibly zero, in such a way that the accuracy of the eigenvalues of Y is preserved in the relative sense by criterion (3). The pole-residue model can be expressed as:

$$Y_{rat}(s) = \sum_m \frac{R_m}{s - a_m} + D + sE \qquad (4)$$

wherein the subscript "rat" denotes a rational function, $R_m$ with m=1 to N are frequency independent matrices (with N being the number of poles or resonances taken into account), D and E are frequency independent matrices or zero, and $a_m$ with m=1 to N are the complex angular frequencies of the poles or resonances.

In exemplary embodiments, it is assumed that the elements of the matrix Y(s) are known at a set of discrete frequencies s (e.g., from direct measurements of the currents i for given voltages v at these frequencies and from obtaining Y from eq. (1) using known techniques). The approximation $Y_{rat}$ according to eq. (4) can be fitted to the known values of Y(s) by varying the a-priory unknown parameters $R_m$, $a_m$ and (if assumed to be non-zero) D and E.

Vector Fitting:

Eq. (4) can be written as a set of $n^2$ equations for all the matrix elements i, j with i=1 to n and j=1 to n of its matrices. These equations are coupled by the common pole set $a_m$.

An exemplary known rational fitting of a scalar frequency response y(s) is as follows.

Rational fitting of a frequency response y(s) by known vector fitting (VF) (see reference [4] identified above) is an iterative process. It amounts to solving the linear problem (5) with a first set of pole frequencies $\{a_m\}$:

$$\overbrace{\left(\sum_{m=1}^{N} \frac{\tilde{r}_m}{s - a_m} + 1\right)}^{\sigma(s)} y(s) \cong \sum_{m=1}^{N} \frac{r_m}{s - a_m} + d + se, \qquad (5)$$

where $\tilde{r}_m$ is a frequency-independent scalar with m=1 to N, y is any element for indices i, j in matrix Y, $r_m$ is the corresponding element in matrix $R_m$, d is the corresponding element in matrix D and e the corresponding element in matrix E.

After solving (5), an improved second set of pole frequencies can be calculated as the zeros of σ(s), which are computed by solving the eigenvalue equation (6)

$$\{a_m\} = \text{eig}(A - b \cdot c^T) \qquad (6)$$

wherein A is a diagonal matrix holding the first set of poles $a_m$ as diagonal elements, b is a vector of ones, c is a vector holding $\tilde{r}_m$ for m=1 to N as obtained by fitting eq. (5) in the previous step. eig is an operator returning a vector holding the eigenvalues of its matrix-valued argument.

The new, second set of (relocated) pole frequencies obtained by (6) can be now reused in (5) in an iterative procedure. This pole relocation procedure can converge in a few iterations.

When applying this procedure to admittance matrices with more than one element, the second step (pole relocation) can be changed. This is achieved by stacking the matrix elements of Y into a single vector, meaning that y(s) in (5) becomes a column vector. Also, the right side of (5) becomes a column vector. Since σ(s) in (5) is still a scalar quantity, all elements in the vector y (and thus the elements of Y) become fitted with a common poles set.

The iteration can continue until a stopping condition is fulfilled (e.g., until the first and second sets of pole frequencies differ by less than a given amount, or until the condition of Eq. (3) is fulfilled for a given limit ε). With the original VF, the iteration may terminate after a predefined number of iterations, or when the norm of the fitting error (e.g. root-mean-square error) does not change much between two iterations. Many alternative criteria could be used, and this is clearly application dependent.

In the final step, the residues $R_m$ are calculated by solving (5) with σ(s)=1.

Modal Vector Fitting:

In accordance with exemplary embodiments disclosed herein, the matrix Y can be diagonalized by a (frequency dependent) transformation matrix T $$Y = T \cdot \Lambda \cdot T^{-1} \cong Y_{rat} \qquad (7)$$

Postmultiplying (7) with T gives for each eigenpair $(\lambda_i, t_i)$ $$Y_{rat} \cdot t_i \cong \lambda_i \cdot t_i \qquad (8)$$

The relative accuracy of the eigenvalue $\lambda_i$ is retained in the least squares problem by scaling the equation with the inverse of the eigenvalue magnitude; i.e.:

$$\frac{1}{|\lambda_i|}(Y_{rat} \cdot t_i - \lambda_i \cdot t_i) \cong 0, \qquad (9)$$

$$i = 1, \ldots, n$$

This scaling is a frequency dependent quantity.

Combining (9) with VF leads to an approach referred to herein as Modal Vector Fitting (MVF).

MVF substantially proceeds just as a known VF process, but it differs in that eq. (5) is now replaced by $$\frac{\lambda_i}{|\lambda_i|}\overbrace{\left(\sum_{m=1}^{N} \frac{\tilde{r}_m}{s-a_m} + 1\right)}^{\sigma(s)} t_i \cong \frac{1}{|\lambda_i|}\left(\left(\sum_{m=1}^{N} \frac{R_m}{s-a_m} + D + sE\right) \cdot t_i\right) \qquad (10)$$

Equation (10) is built for all modes i=1 ... n and stacked into a common equation. The new, second set of (relocated) poles is obtained from σ(s) in (10) by (6), as in the original VF. As in known VF, the residues can be calculated by solving (10) with σ(s)=1.

Utilizing External Circuit Properties:

In some situations a device under consideration is to be connected to an external network with known impedance characteristics; see FIG. 1. If the admittance seen from the terminals of the device is $Y_{ext}$, the total admittance is:

$$Y_{tot} = Y_{device} + Y_{ext} \qquad (11)$$

The terminal behavior is now governed by $Y_{tot}$ rather than $Y_{device}$. This can be utilized in the MVF fitting process by calculating eigenpairs from $Y_{tot}$. Equation (10) now becomes:

$$\frac{\lambda_i}{|\lambda_i|}\overbrace{\left(\sum_{m=1}^{N} \frac{\tilde{r}_m}{s-a_m} + 1\right)}^{\sigma(s)} t_i \cong \frac{1}{|\lambda_i|}\left(\left(Y_{ext} + \sum_{m=1}^{N} \frac{R_m}{s-a_m} + D + sE\right) \cdot t_i\right) \qquad (12)$$

The final computation of residues (with known poles) is done with σ(s) in (12) equal to unity.

EXAMPLE

Figure 2:
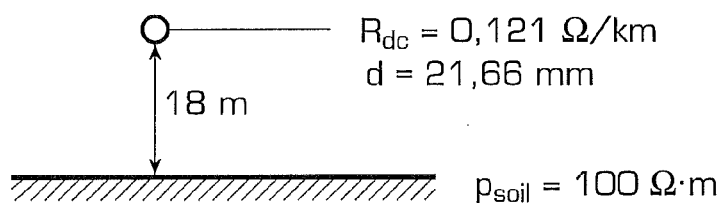
FIG. 2 depicts an exemplary single conductor overhead line.

As an example, consider a lossy conductor over a lossy earth of 5 km length; see FIG. 2. This gives a 2×2 matrix Y.

A pole-residue model for Y was, for example, calculated in the frequency range 1 Hz-100 kHz using VF and MVF. In both cases, the fitting process used five iterations with 14 poles and a nonzero D.

Figure 3:
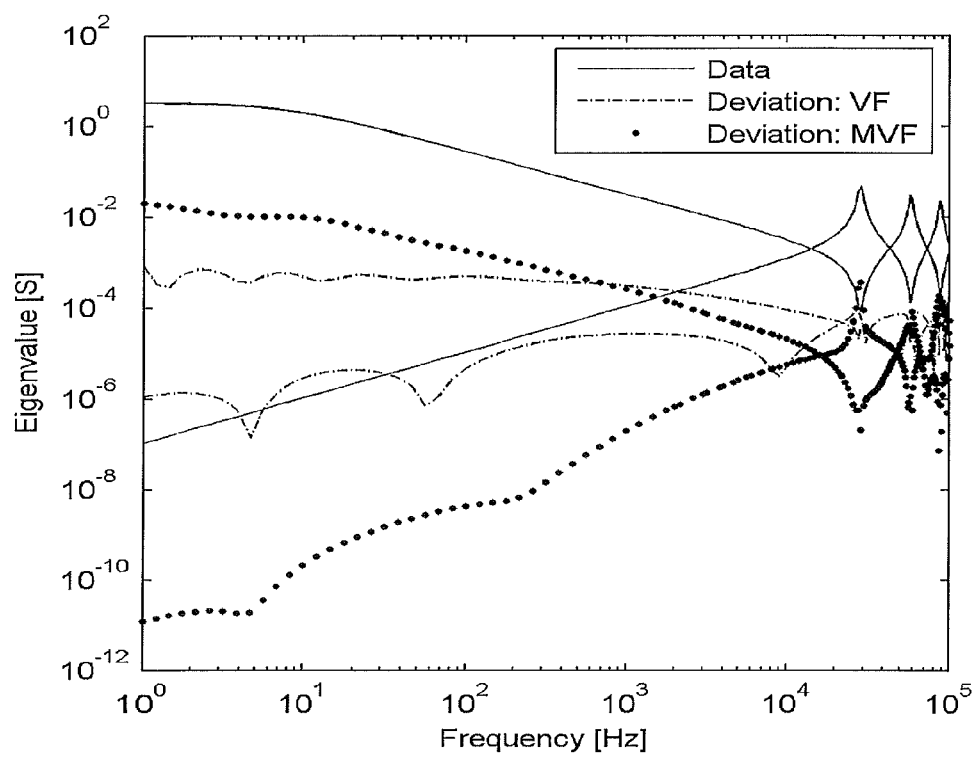
FIG. 3 shows exemplary eigenvalues of Y of the situation of FIG. 2.

FIG. 3 shows eigenvalues of Y. It is observed that when the eigenvalue spread is large (low frequencies), the small eigenvalue becomes inaccurately represented when fitting Y by VF. With MVF, all eigenvalues are accurately represented at all frequencies, due to the relative criterion (3).

Figure 4:
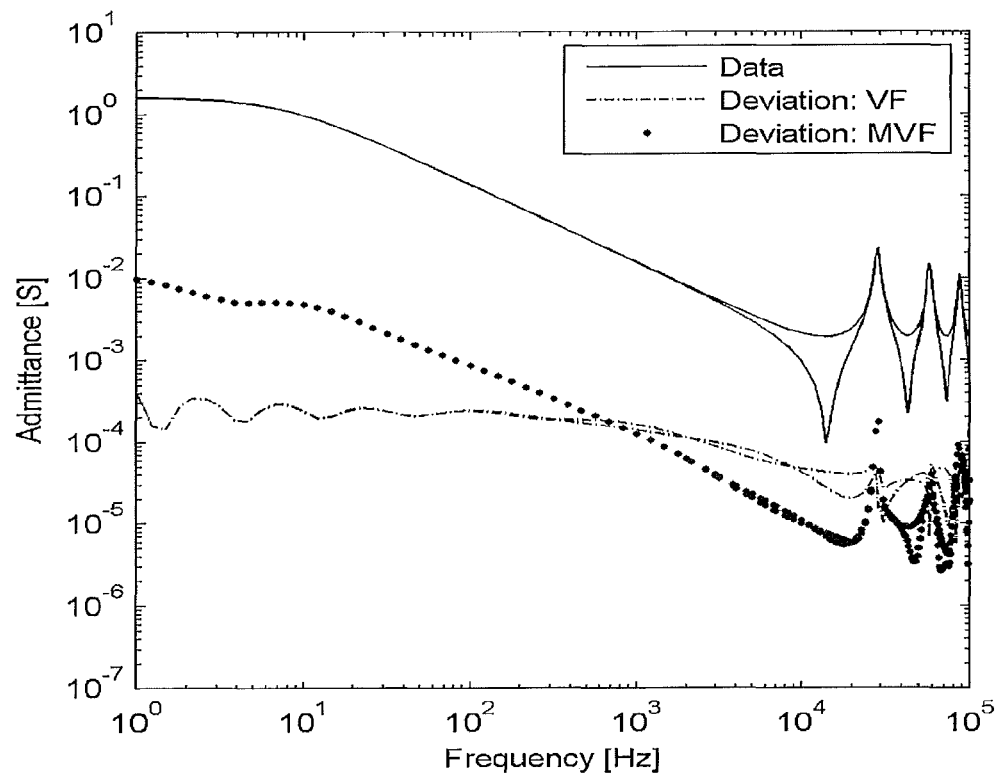
FIG. 4 shows exemplary elements of Y of the situation of FIG. 2.

FIG. 4 (solid traces) shows the elements of Y. The same plot shows the deviation by the rational models from the correct solution. It is observed that with MVF, the deviation curves are closely correlated with the element magnitude, resulting in a close to constant relative accuracy, while VF exhibits strong deviations.

Figure 5:
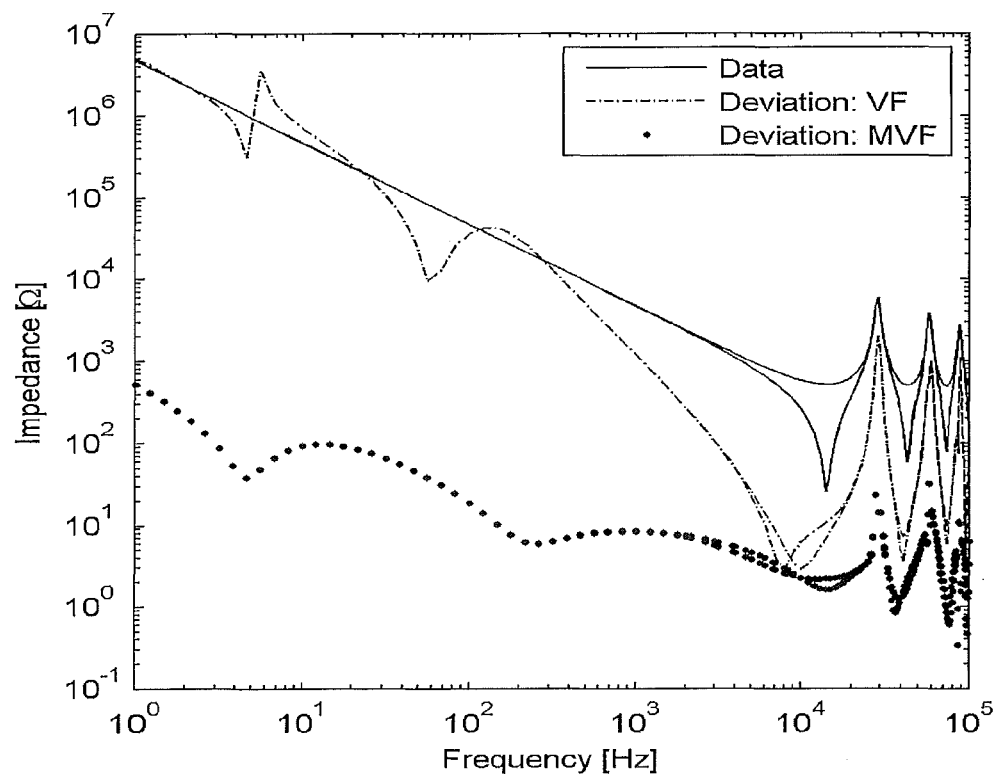
FIG. 5 shows exemplary eigenvalues of the elements of $Z=V^{-1}$ of the situation of FIG. 2.

FIG. 5 shows the result for $Z=Y^{-1}$, which corresponds to the voltage response when applying currents to the line ends. It is seen that the result by MVF remains accurate while that by VF can be considered poor. The latter result is caused by the inability of VF to accurately represent the small eigenvalues, as was shown in FIG. 3. Since the small eigenvalues of Y become the large eigenvalues of Z, a catastrophic error magnification takes place. With MVF, the relative accuracy of eigenvalues is preserved and so an accurate result is ensured also for Z.

Figure 6:
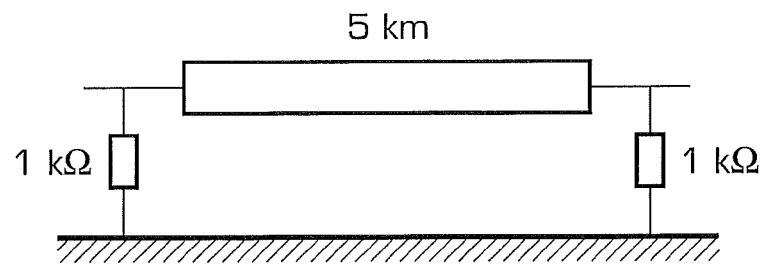
FIG. 6 shows an exemplary electrical component (T-line) connected to an external network.

Result with Inclusion of an External Network:

In the same example, assume that the line is terminated at both ends with a 1 kΩ resistor, see FIG. 6. The fitting of $Y_{device}$ by MVF is now done using (12).

Figure 7:
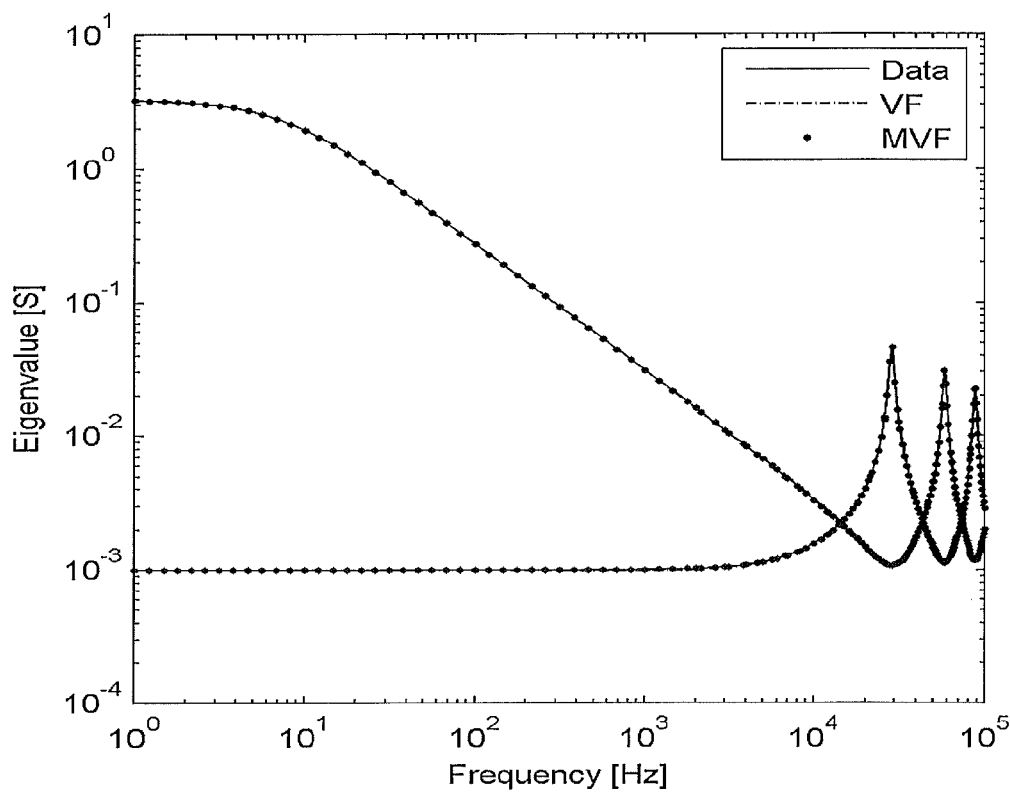
FIG. 7 shows exemplary eigenvalues of $Y_{device}$ of the situation of FIG. 6.

The eigenvalues of $Y_{device}+Y_{ext}$ are shown in FIG. 7. The eigenvalue spread is much smaller than in FIG. 3 due to the connection to ground by the 1 kΩ resistors. Usage of VF and MVF appear to give a similar result. However, inspection of deviation curves shows that the result by MVF is more accurate for the small eigenvalue, see FIG. 8, 9.

Figure 8:
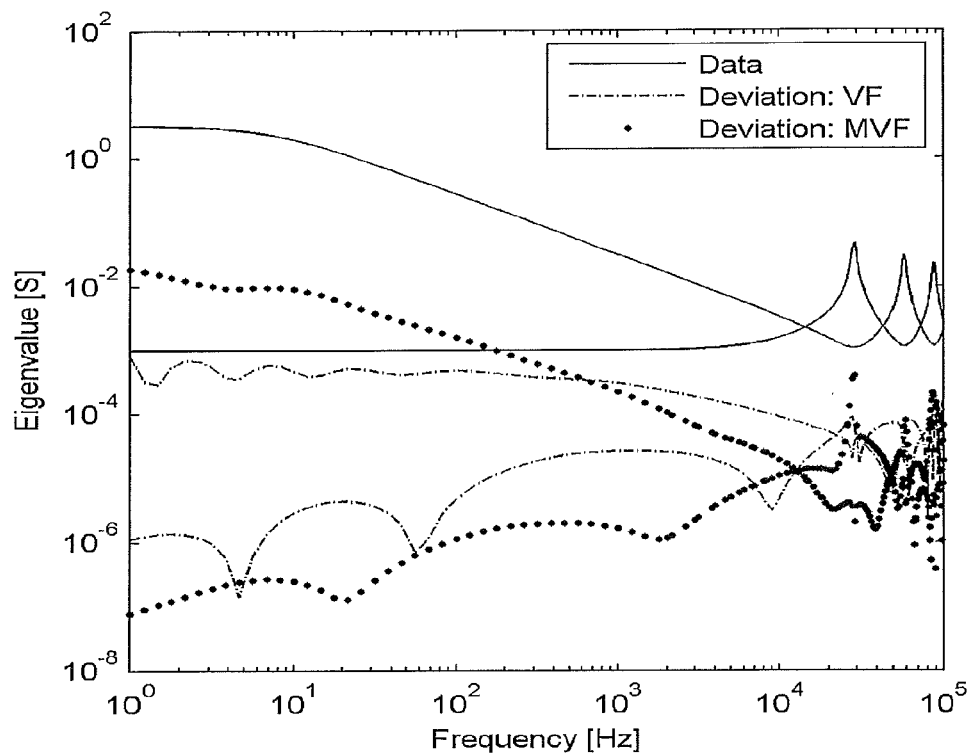
FIG. 8 shows exemplary elements of $Y_{device}$ of the situation of FIG. 6.
Figure 9:
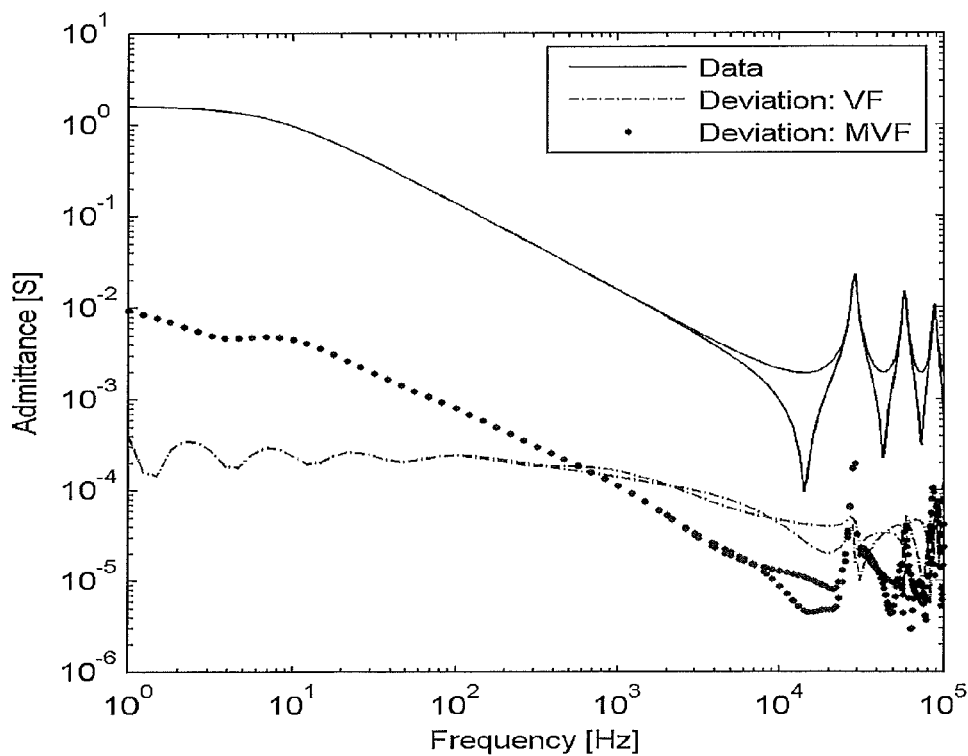
FIG. 9 shows exemplary eigenvalues of elements of $Z=(Y_{device}+Y_{ext})^{-1}$ of the situation of FIG. 6.

As in the previous example, both the VF and MVF approaches give a satisfactory result for the fitted elements of $Y_{device}$ (FIG. 8). But for the elements of $Z=(Y_{device}+Y_{ext})^{-1}$ (FIG. 9), MVF can provide a more accurate result due to the better representation of the small eigenvalue.

Discussion

In some situations, a constant, real transformation matrix $T_y$ can be assumed, for instance when Y is a balanced matrix (which was the case for the example in this description). This allows to diagonalize Y and fit the eigenvalues directly. Usage of inverse magnitude weighting then gives a result similar to MVF. However, in many cases the assumption of a constant $T_y$ does not apply and so MVF can be used.

In a direct application of VF to the matrix elements, one can increase the fitting order while monitoring the eigenvalues of $Y_{model}$ vs. $Y_{device}$ to, for example, achieve a potentially equally good result as MVF, at the cost of a higher fitting order, but such an approach may be more susceptible to noise, generate artifacts and complicate a passivity enforcement.

A different situation arises when modeling from noisy measurements. A set of voltage/current vector pairs that correspond to the system eigenpairs can be measured. Combined with rational fitting and passivity enforcement, this led to the development of the SoFT tool (see [7] M. Tiberg, O. Hoenecke, C. Heitz, and B. Gustaysen, "New simulation methodology for power systems—assumption free analysis entirely based on measurement", EMTP-RV Newsletter, vol. 1, no 3, December 2006, pp. 20-26). Here, usage of MVF can be advantageous since the noise level can be much lower for eigenpairs corresponding to small eigenvalues. Direct application of VF to matrix elements can easily result in that the smallest eigenvalues are lost in the noise. In practical applications, the measured electrical element may have a large eigenvalue spread, whereas the eigenvalues of the adjacent network and the object combined can have a significantly smaller spread. If this knowledge is not utilized, the fitting will be unnecessarily constrained. This problem can be easily avoided by explicitly taking the external network into account when calculating eigenpairs, as was demonstrated above.

Epilogue

A reformulated vector fitting (MVF) procedure has thus been developed that can ensure high accuracy of the obtained model with arbitrary terminal conditions. This can be achieved by explicitly introducing eigenpairs in the modeling, thereby allowing high relative accuracy for all eigenvalues. The application to an example with a large eigenvalue spread demonstrated superior accuracy over the known approach of fitting matrix elements. The MVF approach also allows to take into account impedance characteristics of the adjacent network.

Figure 10:
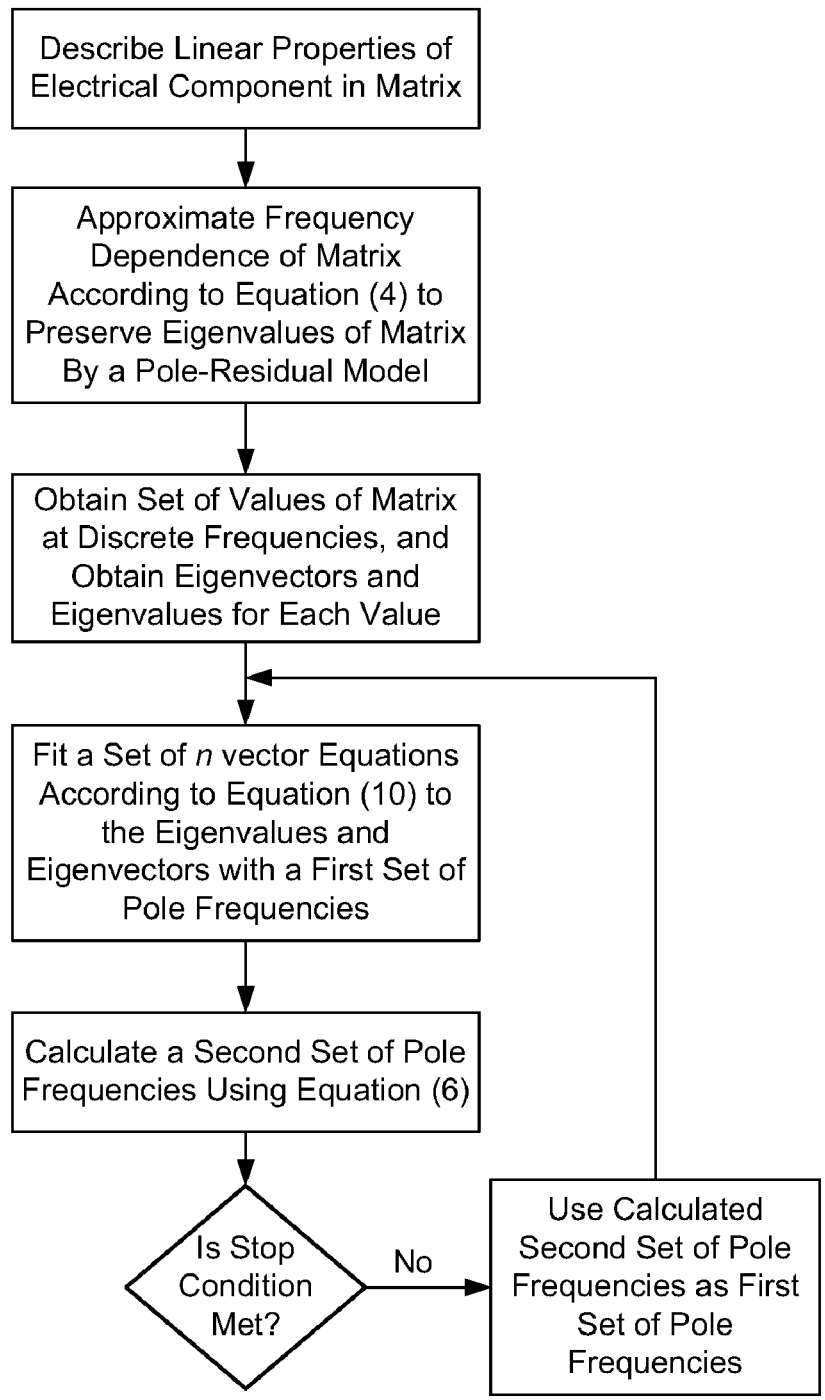
FIG. 10 shows a flowchart of steps of a method for characterizing the frequency dependence of the linear properties of an electrical component.

Exemplary embodiments of the disclosed method allow characterization of a frequency dependence of the linear properties of an electrical component having n>1 ports, which linear properties are described in a matrix Y that relates the voltage applied to the ports to a current through the ports. Y can be the admittance matrix, albeit other matrices, such as the impedance matrix, can be used as well. The frequency dependence of Y is approximated by eq. (4). FIG. 10 shows a flowchart of steps of an exemplary embodiment of the method for characterizing the frequency dependence of the linear properties of an electrical component.

An exemplary method can be implemented in a device such as a computer having a processor, memory and user interface, programmed to execute a program which implements any or all of the disclosed methods, and/or a computer readable medium which includes a program for causing a computer to execute any or all of the methods. The method can comprise:

a) obtaining a set of values Y(s) of Y at discrete frequencies s, and, for each value Y(s), obtaining the eigenvalues $\lambda_i$ and the eigenvectors $t_i$ with i=1 to n. The values of Y(s) can, for example, be obtained from measurements on the electrical component at the desired frequencies;

b) fitting the set of n vector equations of Eq. (10) by using a first set of pole frequencies $a_m$ and by varying the following values: $\tilde{r}_m$, $R_m$ and, if assumed to be non-zero, D and E;

c) calculating a second set of pole frequencies from eq. (6); and d) repeating steps b) and c) by using the second set of pole frequencies $a_m$ obtained in step c) as the first set of pole frequencies in a subsequent step b) until a suitable stop condition is fulfilled.

Knowledge of $R_m$ as well as, optionally, D and E can be desired. These values can be derived in a further step e) by setting σ(s)=1 in Eq. (10) and solving the equation.

When the electrical component is connected to an external device, eq. (10) in step b) can be replaced by eq. (12).

The term D+sE in eqs. (4), (10) and (12) can be replaced by any frequency dependent matrix-valued function $F(\{b_i\}, s)$ that depends linearly on a set of (unknown, but frequency-independent) parameters $\{b_i\}$. The parameters can be determined in the last step d) of the MVF procedure if a sufficient number of measured values of Y is available.

Properties of an electrical component which has been modeled can be output to a user (e.g., via a display) and used to, for example, verify and/or redesign the component (e.g., the electrical component design and/or desired operational frequencies can be produced based on the stop condition).

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The disclosures of references [1]-[7] cited above are all incorporated herein by-reference in their entireties.

What is claimed is:

1. A method for characterizing linear properties of an electrical component having n>1 ports, which linear properties are described in a matrix Y relating a voltage applied to the ports to a current through the ports, wherein a frequency dependence of Y is approximated by $$Y(s) \cong Y_{rat}(s) = \sum_m \frac{R_m}{s - a_m} + D + sE$$

wherein the subscript "rat" denotes a rational function, m runs from 1 to a number N of poles, $R_m$ with m=1 to N are frequency independent matrices, D and E are frequency independent matrices or zero, s denotes a complex angular frequency $i\omega$, and $a_m$ with m=1 to N are complex angular frequencies of the poles, said method comprising:

a) obtaining a set of values Y(s) of Y at discrete frequencies s, and, for each value Y(s), obtaining eigenvalues $\lambda_i$ and eigenvectors $t_i$ with i=1 to n;

b) fitting, in a processor of a computer processing device, a set of n vector equations $$\frac{\lambda_i}{|\lambda_i|}\overline{\left(\sum_{m=1}^{N} \frac{\tilde{r}_m}{s - a_m} + 1\right)}^{\sigma(s)} t_i \cong \frac{1}{|\lambda_i|}\left(\left(\sum_{m=1}^{N} \frac{R_m}{s - a_m} + D + sE\right) \cdot t_i\right)$$

to the eigenvalues $\lambda_i$ and eigenvectors $t_i$, wherein $\tilde{r}_m$ is a frequency-independent scalar with m=1 to N, by using a first set of pole frequencies am and by varying $\tilde{r}_m$, $R_m$ and, if assumed to be non-zero, D and E;

c) calculating, in the processor of the computer processing device, a second set of pole frequencies from:

$$\{a_m\} = eig(A - b \cdot c^T)$$

wherein A is a diagonal matrix holding the first set of pole frequencies am as diagonal elements, b is a vector of ones, c is a vector holding $\tilde{r}_m$ for m=1 to N as obtained by step b), and eig is an operator returning a vector holding eigenvalues of a matrix;

d) repeating steps b) and c) by using the second set of pole frequencies am of step c) as the first set of pole frequencies in a subsequent step b) until a stop condition is met; and e) outputting a model approximating the linear properties of the electrical component in which the applied voltage is related to output currents in the electrical component.

2. The method of claim 1, comprising:

f) setting $\sigma(s)=1$ in the equation of step b) and calculating $R_m$.

3. The method of claim 2, wherein the electrical component is connected to an external device, with linear properties of the external device being described by a matrix $Y_{ext}$, wherein the equations of step b) include:

$$\frac{\lambda_i}{|\lambda_i|}\overline{\left(\sum_{m=1}^{N} \frac{\tilde{r}_m}{s - a_m} + 1\right)}^{\sigma(s)} t_i \cong \frac{1}{|\lambda_i|}\left(\left(Y_{ext} + \sum_{m=1}^{N} \frac{R_m}{s - a_m} + D + sE\right) \cdot t_i\right)$$

4. The method of claim 3, wherein the matrix Y describes the relation between a voltage v applied to the ports of the electrical component and currents i which are to run through the electrical component by $$i \times Yv.$$

5. The method of claim 4, comprising:

utilizing a matrix-valued function $F(\{b_i\}, s)$ that depends linearly on a set of parameters $\{b_i\}$ in the equations of step b).

6. The method of claim 1, wherein the electrical component is connected to an external device and wherein linear properties of the external device are described by a matrix $Y_{ext}$, wherein the equations of step b) include:

$$\frac{\lambda_i}{|\lambda_i|}\overline{\left(\sum_{m=1}^{N} \frac{\tilde{r}_m}{s - a_m} + 1\right)}^{\sigma(s)} t_i \cong \frac{1}{|\lambda_i|}\left(\left(Y_{ext} + \sum_{m=1}^{N} \frac{R_m}{s - a_m} + D + sE\right) \cdot t_i\right)$$

7. The method of claim 1, wherein the matrix Y describes a relation between a voltage v to be applied to the ports of the electrical component and currents i which are to run through the electrical component by:

$$i = Yv.$$

8. The method of claim 1, comprising:

utilizing a matrix-valued function $F(\{b_i\}, s)$ that depends linearly on a set of parameters $\{b_i\}$ in the equations of step b).

9. A device for characterizing linear properties of an electrical component having n>1 ports, which linear properties are described in a matrix Y relating a voltage applied to the ports to a current through the ports, wherein a frequency dependence of Y is approximated by:

$$Y(s) \cong Y_{rat}(s) = \sum_m \frac{R_m}{s - a_m} + D + sE$$

wherein the subscript "rat" denotes a rational function, m runs from 1 to a number N of poles, $R_m$ with m=1 to N are frequency independent matrices, D and E are frequency independent matrices or zero, s denotes a complex angular frequency $i\omega$ and $a_m$ with m=1 to N are complex angular frequencies of the poles, said device comprising:

a computer having a processor configured to execute a computer program recorded on a non-transitory computer-readable recording medium, the program causing the processor to execute operations comprising:

a) obtaining a set of values Y(s) of Y at discrete frequencies s, and, for each value Y(s), obtaining eigenvalues $\lambda_i$ and eigenvectors $t_i$ with i=1 to n;

b) fitting a set of n vector equations:

$$\frac{\lambda_i}{|\lambda_i|}\overline{\left(\sum_{m=1}^{N}\frac{\tilde{r}_m}{s-a_m}+1\right)}^{\sigma(s)}t_i \cong \frac{1}{|\lambda_i|}\left(\left(\sum_{m=1}^{N}\frac{R_m}{s-a_m}+D+sE\right)\cdot t_i\right)$$

to the eigenvalues $\lambda_i$ and eigenvectors $t_i$, wherein $\tilde{r}_m$ is a frequency-independent scalar with m=1 to N, by using a first set of pole frequencies am and by varying $\tilde{r}_m$, $R_m$ and, if assumed to be non-zero, D and E;

c) calculating a second set of pole frequencies from:

$$\{a_m\}=\text{eig}(A-b\cdot c^T)$$

wherein A is a diagonal matrix holding the first set of pole frequencies am as diagonal elements, b is a vector of ones, c is a vector holding $\tilde{r}_m$ for m=1 to N as obtained by step b), and eig is an operator returning a vector holding eigenvalues of a matrix;

d) repeating operations b) and c) by using the second set of pole frequencies am of step c) as the first set of pole frequencies in a subsequent step b) until a stop condition is met; and e) outputting a model approximating the linear properties of the electrical component in which the applied voltage is related to output currents in the electrical component.

10. The device of claim 9, wherein a design of the electrical component and/or a desired operational frequency of the electrical component is based on the stop condition.

11. The device of claim 10, wherein the electrical component is designed for connection to an external device, with linear properties of the external device being described by a matrix $Y_{ext}$, wherein the equations of operation b) include:

$$\frac{\lambda_i}{|\lambda_i|}\overline{\left(\sum_{m=1}^{N}\frac{\tilde{r}_m}{s-a_m}+1\right)}^{\sigma(s)}t_i \cong \frac{1}{|\lambda_i|}\left(\left(Y_{ext}+\sum_{m=1}^{N}\frac{R_m}{s-a_m}+D+sE\right)\cdot t_i\right).$$

12. The device of claim 11, wherein the matrix Y describes the relation between a voltage v to be applied to the ports of the electrical component and currents i which are to run through the electrical component by:

$$i=Yv.$$

13. The device of claim 12, wherein the equations of operation b) include a matrix-valued function $F(\{b_i\}, s)$ that depends linearly on a set of parameters $\{b_i\}$.

14. The device of claim 9, wherein the electrical component is designed for connection to an external device, with linear properties of the external device being described by a matrix $Y_{ext}$, wherein the equations of operation b) include:

$$\frac{\lambda_i}{|\lambda_i|}\overline{\left(\sum_{m=1}^{N}\frac{\tilde{r}_m}{s-a_m}+1\right)}^{\sigma(s)}t_i \cong \frac{1}{|\lambda_i|}\left(\left(Y_{ext}+\sum_{m=1}^{N}\frac{R_m}{s-a_m}+D+sE\right)\cdot t_i\right).$$

15. The device of claim 9, wherein the matrix Y describes a relation between a voltage v to be applied to the ports of the electrical component and currents i which are to run through the electrical component by:

$$i=Yv.$$

16. The device of claim 9, wherein the equations of operation b) includes a matrix-valued function $F(\{b_i\}, s)$ that depends linearly on a set of parameters $\{b_i\}$.

* * * * *